United States Patent [19]

Lapham et al.

[11] Patent Number: 5,529,939
[45] Date of Patent: Jun. 25, 1996

[54] METHOD OF MAKING AN INTEGRATED CIRCUIT WITH COMPLEMENTARY ISOLATED BIPOLAR TRANSISTORS

[75] Inventors: Jerome F. Lapham, Groton; Brad W. Scharf, Winchester, both of Mass.

[73] Assignee: Analog Devices, Incorporated, Norwood, Mass.

[21] Appl. No.: 334,204

[22] Filed: Nov. 4, 1994

Related U.S. Application Data

[63] Continuation-in-part of Ser. No. 95,943, Jul. 22, 1993, which is a continuation of Ser. No. 893,075, Jun. 1, 1992, abandoned, which is a division of Ser. No. 788,883, Nov. 7, 1991, abandoned, which is a division of Ser. No. 430,810, Nov. 1, 1989, Pat. No. 5,065,214, which is a division of Ser. No. 190,499, May 5, 1988, Pat. No. 4,969,823, which is a continuation of Ser. No. 912,771, Sep. 26, 1986, abandoned.

[51] Int. Cl.[6] ................................... H01L 21/265
[52] U.S. Cl. .................. 437/31; 437/55; 437/77; 437/74
[58] Field of Search ..................... 437/31, 55, 74, 437/76, 77, 59, 34, 26, 54

[56] References Cited

U.S. PATENT DOCUMENTS

| | | | |
|---|---|---|---|
| 4,038,680 | 7/1977 | Tagi et al. | 437/54 |
| 4,826,780 | 5/1989 | Takemoto et al. | 437/76 |
| 4,910,160 | 3/1990 | Jennings et al. | 437/31 |
| 4,939,099 | 7/1990 | Seacrist et al. | 437/31 |
| 4,940,671 | 7/1990 | Small et al. | 437/31 |
| 4,965,215 | 10/1990 | Zambrano et al. | 437/31 |
| 4,969,823 | 11/1990 | Lapham et al. | 437/31 |

*Primary Examiner*—Tuan H. Nguyen
*Attorney, Agent, or Firm*—Parmelee, Bollinger & Bramblett

[57] ABSTRACT

Process for making an integrated-circuit (IC) chip with junction-isolated complementary bipolar transistors. In this process an N-well is formed in a P-type substrate. P-type dopant is implanted in the N-well to become a sub-collector for a pnp transistor. N-type dopant is implanted in the substrate in a location laterally displaced from the N-well to become a sub-collector for an npn transistor. N-type material is implanted in the N-well to begin the formation of an isolation wall for the pnp transistor. A P-type epitaxial (epi) layer then is grown over the P-type substrate. N-type material is implanted in the epi layer to complete the isolation wall for the pnp transistor, and to complete the collector for the npn transistor. P-type and N-type material also is implanted in the P-type epi layer to form the bases and emitters for the npn and pnp transistors.

12 Claims, 1 Drawing Sheet

METHOD OF MAKING AN INTEGRATED CIRCUIT WITH COMPLEMENTARY ISOLATED BIPOLAR TRANSISTORS

This application is a continuation-in-part of application Ser. No. 095,943, filed by the present inventors on Jul. 22, 1993. That application is a continuation of Ser. No. 893,075 as filed on Jun. 1, 1992, abandoned, which was a division of Ser. No. 788,883 filed on Nov. 7, 1991, abandoned, which was a division of Ser. No. 430,810 filed on Nov. 1, 1989, now U.S. Pat. No. 5,065,214, which was a division of Ser. No. 190,499 filed on May 5, 1988, now U.S. Pat. No. 4,969,823, which was a continuation of application Ser. No. 912,771 originally filed Sep. 26, 1986, now abandoned.

BACKGROUND OF THE INVENTION

1. Field of the Invention

This invention relates to monolithic integrated circuit (IC) devices. More particularly, this invention relates to improved IC devices having complementary isolated bipolar transistors.

2. Description of the Prior Art

It has for many years been known to provide integrated circuits (ICs) having isolated complementary transistors, i.e. both npn and pnp transistors. Circuits employing complementary transistors have important advantages, such as relatively low power consumption when used in push-pull configurations (where one transistor is off while the other is on). Advantageously, complementary ICs employ vertical npn and pnp structures which offer performance benefits. Typically, complementary ICs comprise a P-type substrate having an N-type epitaxial layer.

Known complementary IC devices have not been entirely satisfactory, particularly with respect to performance capabilities when used as amplifiers. Various proposals have been made from time to time in an effort to improve such devices, such as the use of more than one epitaxial layer, and other variations of the basic semiconductive structure. Nonetheless, many modern day complementary bipolar transistor ICs suffer still from important disabilities, and circuit designers have been seeking improved characteristics to permit them to use complementary ICs in more demanding applications.

One of the problems with conventional complementary ICs is that the relative performance capabilities of the two transistor types (npn and pnp) are not balanced. In one sense, this problem may be considered an inherent difficulty, since npn transistors are inherently better than pnp transistors. That is, the mobility of electrons, in npn transistors, is about 2.5 times higher than the mobility of holes, in pnp transistors. Nevertheless, achieving improved balance between the performance of npn and pnp transistors in a complementary IC (sometimes referred to as achieving improved "complementarity") can be very helpful to circuit designers in developing high-performance IC products. Indeed, some degradation of npn performance can be considered an acceptable trade-off for enhanced pnp performance, provided that both types of transistors have performance characteristics of suitably high level.

One characteristic of special importance to some circuit designers is the figure of merit referred to as $\beta \cdot V_A$. This figure represents the product of transistor current gain ("$\beta$" is equal to Ic/Ib) and "Early Voltage" ("$V_A$"—an extrapolated voltage intercept on a set of I—V curves). In conventional prior art complementary IC devices, the product $\beta \cdot V_A$ typically may be markedly different for the two different types of transistors. For many kinds of circuits, it is highly desirable that the two transistor types have more nearly equal $\beta \cdot V_A$ product. However, the product $\beta \cdot V_A$ should nevertheless be quite high for both types of transistors.

SUMMARY OF THE INVENTION

It has been determined that the Early Voltage $V_A$ is approximately proportional to $N_B/N_C$, where $N_B$ is the doping concentration of the transistor base and $N_C$ is the doping concentration of the transistor collector. $V_A$ thus can be increased by increasing $N_B$, or decreasing $N_C$. The current gain $\beta$ of a transistor is inversely proportional to $Q_B$, which is related to the concentration of dopant in the transistor base.

In a preferred embodiment of the invention, there is provided an improved monolithic integrated circuit with complementary junction-isolated bipolar transistors comprising a P-type substrate with a single epitaxial layer of P-type material. In a sequence of steps, the substrate is implanted with P-type and N-type dopant which is subsequently diffused (driven-in). After epitaxy is grown over the substrate, additional P-type and N-type material is implanted and diffused into the epitaxial layer, as will be described hereinbelow in detail. The end result is a complementary IC having importantly advantageous characteristics, especially high $\beta \cdot V_A$ product for both types of transistors, and also excellent gain-bandwidth product.

In a complementary bipolar process, either the npn or the pnp transistor can have a diffused collector, i.e. a collector formed by diffusing one type of dopant (P or N) into a region which initially is of the other type. Such a diffused collector would be more heavily doped than the non-diffused collector. A higher Early Voltage for the pnp transistor may be obtained by having its collector more lightly doped than the collector of the npn transistor, thereby effecting better balance between the different type transistors. This is an important gain as a pnp has 3–5 times less base doping than an npn having the same beta, and is therefore at a 3–5 times disadvantage in Early Voltage. In accordance with one important aspect of the present invention, this result is achieved by forming the collector of the pnp transistor from a P-type epitaxial layer. Because this epitaxial layer need not be diffused (compensated) to P-type, it is more lightly doped than the collector of the npn transistor, and thus provides the desired enhancement of the pnp characteristics.

In still another aspect of the present invention, the substrate is P-type and is formed with an N-well for isolation of the pnp transistor. The npn transistor is formed in the P-type substrate and P-type epitaxial layer, without a well as was used in the earlier configuration shown in parent application Ser. No. 08/095,943.

The welled pnp configuration of the present application makes possible higher voltage slewing-speed operation for the npn transistor, e.g., a speed ratio of perhaps 3:1 for the npn/pnp transistors. This is an advantageous feature for some IC circuits.

Other objects, aspects and advantages of the invention will in part be pointed out in, and in part apparent from, the following detailed description of a preferred embodiment of the invention, considered together with the accompanying drawings.

DETAILED DESCRIPTION OF A PREFERRED EMBODIMENT

Figure 1:
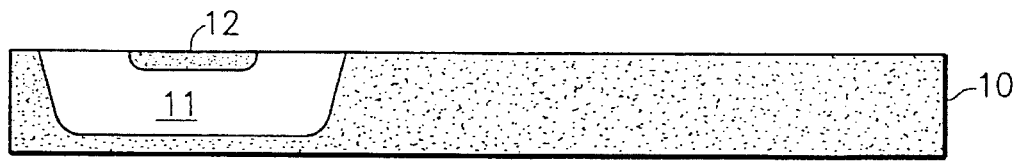
FIGS. 1 through 6 show dopant diffusion patterns in sequential views of a cross-section of a P-type substrate and a P-type epitaxial layer. P-type material is shown stippled and N-type material is shown unmarked. Interrupted lines are used in the drawings as a convention to indicate the merging of regions of the same conductivity type.

Referring now to FIG. 1, there is shown in section a portion 10 of a silicon substrate having P-type dopant, e.g. with a concentration of about $10^{15}$ atoms/cm.$^3$. Starting with this substrate, the first principal step in the new complementary-bipolar (CB) process is to ion-implant a region 11 with phosphorous to form an N-well. The phosphorous dose may be about $5\times10^{13}$ atoms/cm.$^2$ formed with an implant energy of about 100 KeV. The phosphorous implant 11 is driven-in (i.e. diffused down into the substrate) at a temperature of about 1250° C. for a time period of about 60 minutes.

A region 12 of this well then is ion-implanted with boron to serve ultimately as a sub-collector for a pnp transistor to be formed. The boron dose may be about $2.5\times10^{15}$ atoms/cm.$^2$, formed with an implant energy of about 100 KeV. These implants (and others referred to hereinafter) are made in known fashion, as by opening an oxide or photoresist layer to establish a window (e.g., rectangular in plan view) for the implant.

The boron implant 12 is driven-in at a temperature of about 1250° C. for about 60 minutes.

Figure 2:
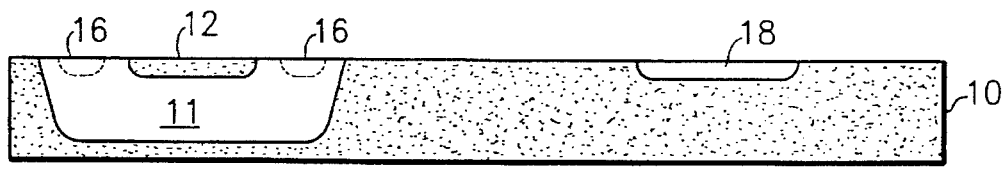

Referring now to FIG. 2, a second phosphorous implant is made in the region indicated at 18 in the substrate, off-set laterally from the first implant region 11. This second phosphorous implant is to serve ultimately as a sub-collector of an npn transistor. The dose of the implant in the region 18 may be about $1\times10^{15}$ atoms/cm.$^2$, made at an implant energy of about 100 KeV. This implant is driven-in at a temperature of about 1250° C., for a time period of about 30 minutes. If desired, this phosphorous implant 18 may be augmented by an arsenic or antimony implant of about $1\times10^{15}$ atom/cm.$^2$ at 100 KeV.

Still referring to FIG. 2, an N-type implant also is made in the region 16. This implant region 16 is to develop part of an isolation wall surrounding the pnp transistor when it is completed, and may for example define a closed rectangular configuration, as seen in plan view, surrounding the diffused implant region 12. This implant 16 may be phosphorous having a dose of about $10^{15}$ atoms/cm.$^2$ implanted with an energy of about 100 KeV, and driven-in at a temperature of about 1250° C. for a time period of 30 minutes. If desired, said phosphorous implant may be augmented by an arsenic or antimony implant dose of about $1\times10^{15}$ atoms/cm.$^2$ at 100 KeV.

Figure 3:
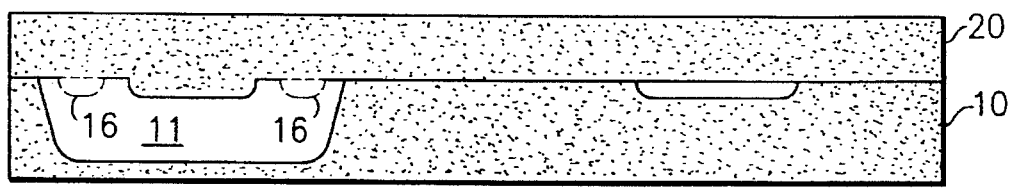

The next principal step in the process is to grow P-type epitaxy to form a layer 20 over the P-type substrate 10, as shown in FIG. 3. This epitaxial layer may for example be 15.5 microns thick, with boron dopant at a concentration of about $10^{15}$ atoms/cm.$^3$.

Figure 4:
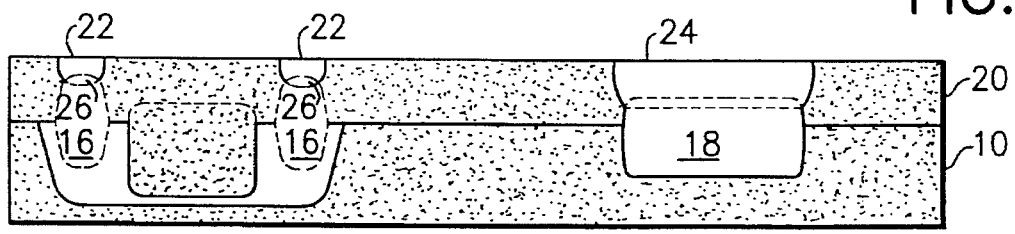

Referring now to FIG. 4, phosphorous (N-type) implants are made in the regions indicated at 22 and 24 in the epitaxial layer 20. These implants may have a dose of about $2.3\times10^{12}$ atoms/cm.$^2$, at an implant energy of 150 KeV.

The implant region 22 is immediately above the N-type implant region 16 previously formed in the substrate 10 (see FIG. 2). The other N-type implant region 24 is directly over the N-type implant 18 previously formed in the substrate 10 (FIG. 2). The implants 22 and 24 are driven-in at a temperature of about 1250° C. for a time period of about 250 minutes, and diffuse downwardly into the epitaxial layer. While this downward diffusion is taking place, the previous implants 16 and 18 diffuse upwardly into the epitaxial layer, merging with the diffused implants 22 and 24 in central regions indicated by the interrupted cross-over lines 26 and 28. The merged N diffusions 16 and 22 complete the isolation wall around the region for the pnp transistor. The merged N diffusions 18 and 24 define the collector region for the npn transistor being formed.

As described above, during drive-in the substrate implants 16 and 18 diffuse upwardly in the processing illustrated in FIG. 4, while the epitaxial layer implants 22 and 24 diffuse downwardly during that processing. Thus implants such as made in regions 16 and 18 often are referred to as "up" regions, while implants such as made in regions 22 and 24 often are referred to as "down" regions.

During this drive-in step, the substrate implants in regions 12, 16 and 18 also diffuse downwardly, deeper into the substrate 10, as indicated in FIG. 4.

Figure 5:
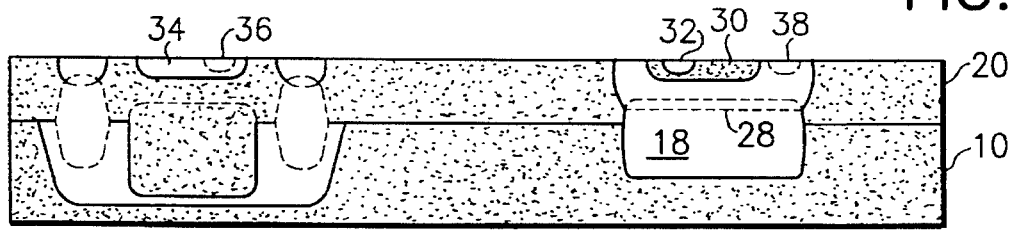

Turning now to FIG. 5, implants are next made into regions indicated at 30, 32, 34, 36 and 38 of the epitaxial layer 20. The implant at region 30 is of P-type material (e.g. boron) to serve as the base for the npn transistor. N-type material (e.g. arsenic) is implanted in region 32 within the P-type npn base region 30, to serve as the emitter of the npn transistor. Another N-type implant (e.g. phosphorous) is made in a region indicated at 34 to serve as the base for the pnp transistor.

The boron implant at region 30 may have a dose of $3\times10^{14}$ atoms/cm.$^2$, implanted with an energy of 100 KeV. The arsenic implant at region 32 may have a dose of $8\times10^{15}$ atoms/cm.$^2$, with an implant energy of 100 KeV. The phosphorous implant at region 34 may have a dose of $2.0\times10^{14}$ atoms/cm.$^2$, with an implant energy of 100 KeV.

Implants corresponding to the npn emitter implant in region 32 are made simultaneously in the regions indicated at 36 and 38. The first of these emitter implants in region 36 serves as a "base contact diffusion" to enhance the contact-forming properties within the pnp base region 34. The other emitter implant in region 38 serves as a collector contact diffusion for the npn collector.

The implants in regions 30–38 then are driven in at a temperature of about 1100° C. for a time period of about 120 minutes.

Figure 6:
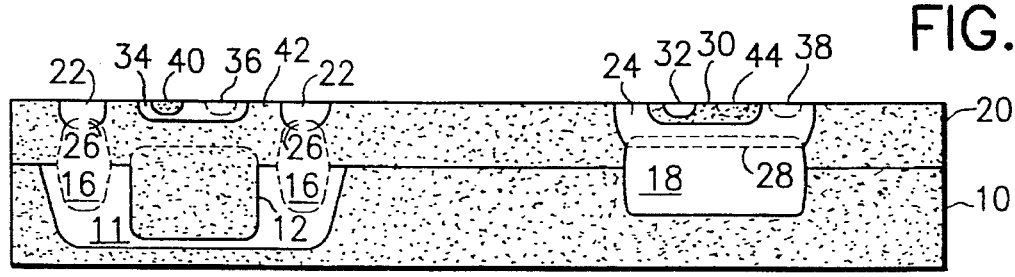

Referring now to FIG. 6, boron next is implanted in the region indicated at 40 to form the emitter for the pnp transistor. This implant may be at a dose of $6.5\times10^{15}$ atoms/cm.$^2$, with an implant energy of 100 KeV. Corresponding implants are made in the regions indicated at 42 and 44 to enhance the contact-making properties for the pnp collector and the npn base. The boron implants are then driven-in at a temperature of about 1000° C. for a time period of about 60 minutes to complete formation of the basic complementary IC structure in accordance with the invention.

Further conventional processing will of course be necessary to complete fabrication of the final product, including formation of other circuit elements such as resistors, formation of contacts and metallization as required. Novel devices manufactured by the new process described above have superior characteristics for widely different applications.

Although a specific preferred embodiment of the inventive IC structure and processing thereof have been described above in detail, it is to be understood that this is exemplary only, and not to be interpreted as limiting. Those skilled in this art may make many variations of the disclosed techniques and arrangements to suit particular applications without departing from the scope of this invention. For example, in many instances the sequences of procedural steps set forth above can be altered while still carrying out the basic concepts of the invention. Predeposit diffusions may be substituted for the implantation steps in many cases. Also, changes in processing conditions such as drive-in temperatures and time periods, can be made in accordance with known technology. Still other changes can be made as appropriate to meet different requirements.

What is claimed is:

1. The method of making an integrated circuit with complementary bipolar transistors comprising the following steps (not necessarily in the order recited):

forming an N-well in a P-type substrate;

introducing P-type material in said N-well to form a sub-collector for a pnp transistor;

introducing N-type material in said substrate to form up regions to (a) partially establish an npn collector and (b) partially establish an isolation wall for said pnp transistor;

forming a P-type epitaxial (epi) layer over said P-type substrate;

introducing N-type material into said epi layer to form down regions to (1) merge with said N-type collector up region and (2) merge with said N-type isolation up region to form said isolation wall;

introducing P-type material in said epi layer to form a base for said npn transistor;

introducing N-type material in said epi layer to form an emitter for said npn transistor;

introducing N-type material in said epi layer to form a base for said pnp transistor; and introducing P-type material in said epi layer to form an emitter for said pnp transistor.

2. The method of making an integrated circuit with complementary bipolar transistors comprising the following steps (not necessarily in the order recited):

forming a P-type epitaxial (epi) layer over a P-type substrate;

introducing N-type material to form a collector region in said epi layer for an npn transistor;

introducing N-type material in said P-type epi layer to establish an N-type isolation wall surrounding a portion of said P-type epi layer, so that said portion can serve as a collector region of a pnp transistor;

introducing P-type material in said epi layer to form a base region for said npn transistor;

Introducing N-type material in said epi layer to form an emitter region for said npn transistor;

introducing N-type material in said epi layer to form a base region for said pnp transistor; and introducing P-type material in said epi layer to form an emitter region for said pnp transistor.

3. The method of claim 2, including the step of introducing N-type material to form an N-well in said substrate to surround said pnp collector in said substrate.

4. The method of making an integrated circuit with complementary bipolar transistors comprising the following steps (not necessarily in the order recited):

growing a P-type epi layer over a P-type substrate;

introducing N-type material in said epi layer to form a collector region for an npn transistor;

establishing in said P-type epi layer an isolation barrier surrounding a portion of said P-type epi layer so that said portion can serve as a collector region of a pnp transistor;

introducing P-type material in said epi layer to form a base region for said npn transistor;

introducing N-type material in said epi layer to form an emitter region for said npn transistor;

introducing N-type material in said epi layer to form a base region for said pnp transistor; and introducing P-type material in said epi layer to form an emitter region for said pnp transistor.

5. The method of making an integrated circuit with complementary bipolar transistors comprising the following steps (not necessarily in the order recited):

forming an N-well in a P-type substrate;

introducing P-type impurity in said N-well to form a sub-collector for a pnp transistor;

growing a P-type epitaxial (epi) layer over said P-type substrate;

introducing N-type material in said P-type epi layer to form a collector region for an npn transistor;

introducing N-type material in said P-type epi layer to establish an N-type isolation wall surrounding a portion of said P-type epi layer which is above said P-type impurity in said substrate;

introducing at least one impurity in said epi layer to form a base region for at least one of said transistors;

introducing N-type material in said epi layer to form an emitter region for npn transistor; and introducing P-type material in said epi layer to form an emitter region for said pnp transistor.

6. The method of claim 5, including the steps of introducing P-type and N-type impurities in said epi layer to form the bases for both of said transistors respectively.

7. The method of claim 5, wherein the N-type material introduced into said P-type epi layer to form a collector region for the npn transistor provides a dopant concentration higher than the concentration of dopant in said epi layer serving as the collector of said pnp transistor.

8. The method of making an integrated circuit with complementary bipolar transistors comprising the following steps (not necessarily in the order recited):

forming an N-region in a P-type substrate;

introducing P-type impurity in said N-region to form a sub-collector for a pnp transistor;

growing a P-type epitaxial (epi) layer over said P-type substrate;

introducing N-type material in said P-type epi layer to form a collector region for an npn transistor;

introducing N-type material in said P-type epi layer to establish an N-type isolation wall surrounding a portion of said P-type epi layer which is above said P-type impurity in said substrate;

introducing at least one impurity in said epi layer to form a base region for at least one of said transistors;

introducing N-type material in said epi layer to form an emitter region for said npn transistor; and introducing P-type material in said epi layer to form an emitter region for said pnp transistor.

9. The method of claim 8, wherein said N-type collector region has a dopant concentration higher than the concentration of dopant in said epi layer serving as the collector of said pnp transistor.

10. The method of making an integrated circuit with complementary bipolar transistors comprising the following steps (not necessarily in the order recited):

growing a P-type epitaxial (epi) layer over a P-type substrate;

introducing N-type material in said epi layer to form a collector region for an npn transistor;

establishing in said P-type epi layer an isolation barrier surrounding a portion of said P-type epi layer so that said portion can serve as a collector region of a pnp transistor;

introducing P-type material in said epi layer to form a base region for said npn transistor;

introducing N-type material in said epi layer to form an emitter region for said npn transistor;

introducing N-type material in said epi layer to form a base region for said pnp transistor; and introducing P-type material in said epi layer to form an emitter region for said pnp transistor.

11. The method of claim 10, wherein said N-type collector region has a dopant concentration higher than the concentration of dopant in said epi layer.

12. The method of making an integrated circuit (IC) chip with complementary bipolar transistors comprising the following steps (not necessarily in the order recited):

growing a P-type epi layer over a P-type substrate;

introducing N-type material in said epi layer to form a collector region for an npn transistor;

establishing in said P-type epi layer an isolation barrier surrounding a portion of said P-type epi layer so that said portion can serve as a collector region of a pnp transistor;

introducing an impurity in said epi layer to form a base region for one of said complementary transistors;

introducing N-type material in said epi layer to form an emitter region for said npn transistor; and introducing P-type material in said epi layer to form an emitter region for said pnp transistor;

said portion of said epi layer serving as a collector region of the pnp transistor being more lightly doped than said collector region for said npn transistor.

* * * * *